(12) United States Patent
Ravilla et al.

(10) Patent No.: US 12,682,197 B2
(45) Date of Patent: Jul. 14, 2026

(54) PIEZO-BASED CIRCUIT FOR MODIFYING FUNCTIONALITY OF RFID TAGS

(71) Applicant: Hand Held Products, Inc., Charlotte, NC (US)

(72) Inventors: Sridhar Ravilla, Charlotte, NC (US); Kailash Kashyap Godawarthy, Charlotte, NC (US); Pankaj Kumar Pandey, Charlotte, NC (US)

(73) Assignee: Hand Held Products, Inc., Charlotte, NC (US)

( * ) Notice: Subject to any disclaimer, the term of this patent is extended or adjusted under 35 U.S.C. 154(b) by 0 days.

(21) Appl. No.: 18/764,666

(22) Filed: Jul. 5, 2024

(65) Prior Publication Data

US 2025/0028922 A1     Jan. 23, 2025

(30) Foreign Application Priority Data

Jul. 20, 2023     (IN) .............................. 202311048800

(51) Int. Cl.
| | |
|---|---|
| *G06K 19/07* | (2006.01) |
| *H02N 2/18* | (2006.01) |
| *H10N 30/30* | (2023.01) |

(52) U.S. Cl.
CPC ......... *G06K 19/0709* (2013.01); *H02N 2/181* (2013.01); *H10N 30/30* (2023.02)

(58) Field of Classification Search
CPC ..... G06K 19/0709; H01N 30/30; H02N 2/181
USPC ....................................................... 235/492
See application file for complete search history.

(56) References Cited

U.S. PATENT DOCUMENTS

| | | | | |
|---|---|---|---|---|
| 11,245,381 | B2 * | 2/2022 | Schmalzl | ............... H03H 9/547 |
| 2007/0205897 | A1 | 9/2007 | Forster | |
| 2008/0122518 | A1 * | 5/2008 | Besser | .................... H02J 7/865 |
| | | | | 327/518 |
| 2010/0315922 | A1 | 12/2010 | Maetz et al. | |
| 2011/0012723 | A1 | 1/2011 | Adamson et al. | |
| 2011/0181399 | A1 * | 7/2011 | Pollack | .............. G06K 19/0717 |
| | | | | 340/10.33 |
| 2012/0068827 | A1 | 3/2012 | Yi et al. | |
| 2012/0305654 | A1 * | 12/2012 | Wang | ............... G06K 19/07707 |
| | | | | 235/492 |
| 2018/0069507 | A1 * | 3/2018 | Dueweke | ............... H03B 5/364 |
| 2019/0028041 | A1 * | 1/2019 | Badel | .................... H02M 7/219 |
| 2022/0171949 | A1 | 6/2022 | Xu et al. | |
| 2022/0241949 | A1 | 8/2022 | Heine et al. | |

OTHER PUBLICATIONS

Extended European Search Report Mailed on Dec. 9, 2024 for EP Application No. 24181833, 10 page(s).
EP Office Action Mailed on Dec. 17, 2025 for EP Application No. 24181833, 3 page(s).

* cited by examiner

*Primary Examiner* — Michael G Lee
*Assistant Examiner* — David Tardif
(74) *Attorney, Agent, or Firm* — ALSTON & BIRD LLP

(57)     ABSTRACT

A radio frequency identification (RFID) tag comprising a tag integrated circuit (IC), an antenna coupled to the tag IC, and an impedance tuned circuit coupled to the antenna, wherein the impedance tuned circuit configured to tune a circuit impedance of the antenna based on power received by the impedance tuned circuit. The RFID tag further comprises a piezo electric energy harvesting module coupled to the impedance tuned circuit, wherein the piezo electric energy harvesting module is configured to supply the power to the impedance tuned circuit.

13 Claims, 7 Drawing Sheets

104

PIEZO-BASED CIRCUIT FOR MODIFYING FUNCTIONALITY OF RFID TAGS

CROSS-REFERENCE TO RELATED APPLICATIONS

This application claims priority pursuant to 35 U.S.C. 119(a) to Indian Application No. 202311048800, filed Jul. 20, 2023, which application is incorporated herein by reference in its entirety.

FIELD OF THE INVENTION

Example embodiments of the present disclosure relate generally to radio-frequency identification (RFID) tags, and in particular, to RFID tags having communication functionality based on their movement.

BACKGROUND

RFID systems can be used in a wide range of applications, such as in retail supply chain, postal logistics, healthcare, or manufacturing, to name a few. For example, an RFID system may be used to facilitate the identification and tracking of assets that need to be reliably monitored and/or controlled within a particular environment. The use of RFID in such applications has resulted in a more secure, efficient, and accurate system for managing assets. RFID systems may be used to trace and track each individual asset from an origination to a destination with its individual identifying information.

Applicant has identified many technical challenges and difficulties associated with conventional RFID systems.

BRIEF SUMMARY

Various embodiments described herein relate to methods, components, and apparatuses for modifying communication functionality of radio frequency identification (RFID) tags based on movement of the RFID tags.

In accordance with various embodiments of the present disclosure, an RFID tag is provided. In some embodiments, the RFID tag comprises a tag integrated circuit (IC), an antenna coupled to the tag IC, and an impedance tuned circuit coupled to the antenna, wherein the impedance tuned circuit is configured to tune a circuit impedance of the antenna based on power received by the impedance tuned circuit. In some embodiments, the RFID tag further comprises a piezo electric energy harvesting module coupled to the impedance tuned circuit, wherein the piezo electric energy harvesting module is configured to supply the power to the impedance tuned circuit.

In some embodiments, the impedance tuned circuit is further configured to control operation of the antenna and the tag IC by tuning a circuit impedance of the antenna. In some embodiments, the RFID tag further comprises a latching switch coupled from the piezo electric energy harvesting module to the impedance tuned circuit. In some embodiments, the piezo electric energy harvesting module comprises a piezoelectric transducer, a power management module, and an energy storage unit. In some embodiments, the impedance tuned circuit is further configured to tune the circuit impedance of the antenna to match a functional impedance of the tag IC based on the power received by the impedance tuned circuit. In some embodiments, the impedance tuned circuit is further configured to: (i) tune a first circuit impedance for the antenna based on no power is received from the piezo electric energy harvesting module, and (ii) tune a second circuit impedance for the antenna based on power is received from the piezo electric energy harvesting module. In some embodiments, the first circuit impedance for the antenna comprises a non-functional circuit impedance and the second circuit impedance for the antenna comprises a functional circuit impedance. In some embodiments, the non-functional circuit impedance comprises an impedance greater than a functional impedance of the tag IC and the functional circuit impedance comprises the functional impedance of the tag IC. In some embodiments, the piezo electric energy harvesting module is further configured to supply the power to the impedance tuned circuit based on movement of the RFID tag. In some embodiments, the piezo electric energy harvesting module is further configured to stop supplying the power to the impedance tuned circuit based on non-movement of the RFID tag.

According to another embodiment, an RFID tag comprises an antenna configured to receive and transmit radio frequency (RF) signals, and a tag integrated circuit (IC) coupled to the antenna, wherein the tag IC comprising an input/output (I/O) port, and the tag IC is configured to generate discrete signals for transmission in the RF signals based on electric signals received on the I/O port. In some embodiments, the RFID tag further comprises a piezo electric energy harvesting module coupled to the I/O port, wherein the piezo electric energy harvesting module is configured to generate the electric signals to the I/O port.

In some embodiments, the piezo electric energy harvesting module is further configured to generate the electric signals based on movement of the RFID tag. In some embodiments, the tag IC is further configured to generate the discrete signals based on movement of the RFID tag. In some embodiments, the tag IC is further configured to generate a high discrete signal based on the RFID tag being in motion. In some embodiments, the tag IC is further configured to generate a low discrete signal based on the RFID tag being stationary.

The foregoing illustrative summary, as well as other exemplary objectives and/or advantages of the disclosure, and the manner in which the same are accomplished, are further explained in the following detailed description and its accompanying drawings.

BRIEF DESCRIPTION OF THE DRAWINGS

The description of the illustrative embodiments may be read in conjunction with the accompanying figures. It will be appreciated that, for simplicity and clarity of illustration, elements illustrated in the figures have not necessarily been drawn to scale, unless described otherwise. For example, the dimensions of some of the elements may be exaggerated relative to other elements, unless described otherwise. Embodiments incorporating teachings of the present disclosure are shown and described with respect to the figures presented herein, in which.

DETAILED DESCRIPTION

Figure 1:
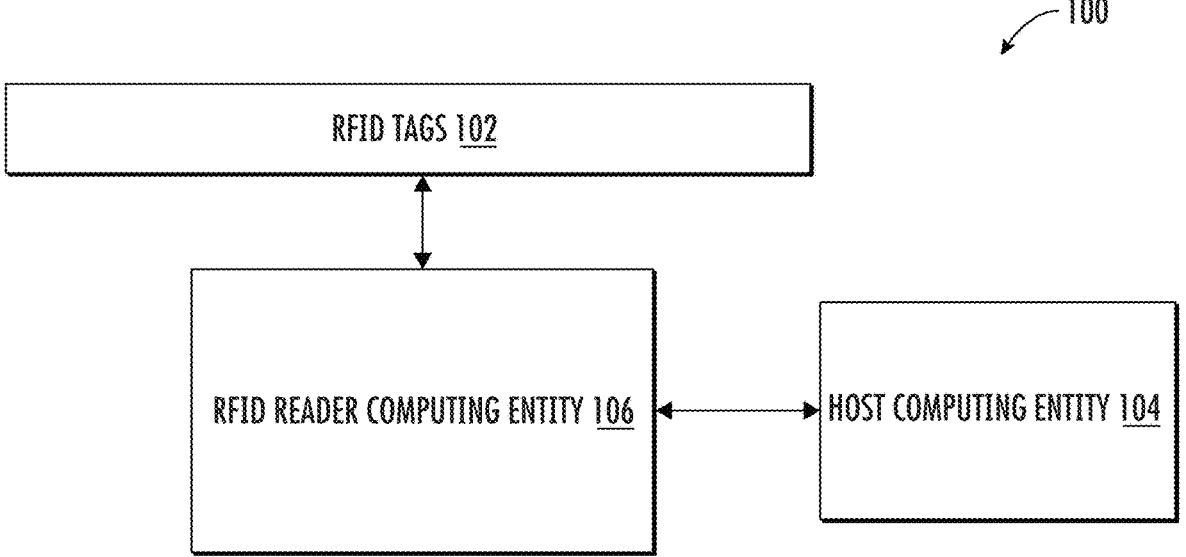
FIG. 1 illustrates an exemplary overview of an architecture that can be used to practice embodiments of the present disclosure.

Some embodiments of the present disclosure will now be described more fully hereinafter with reference to the accompanying drawings, in which some, but not all embodiments of the disclosure are shown. Indeed, these disclosures may be embodied in many different forms and should not be construed as limited to the embodiments set forth herein; rather, these embodiments are provided so that this disclosure will satisfy applicable legal requirements. Like numbers refer to like elements throughout.

As used herein, terms such as "front," "rear," "top," etc., are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in one embodiment," "according to one embodiment," and the like generally mean that the particular feature, structure, or characteristic following the phrase may be included in at least one embodiment of the present disclosure, and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such a component or feature may be optionally included in some embodiments, or it may be excluded.

One skilled in the art will appreciate that for certain application environments, a longer read range than wanted can cause problems. In an example scenario, a radio frequency identification (RFID) reader may be installed in a package vehicle to monitor packages with RFID tags. It may be desirable to monitor only packages kept in the vehicle and to avoid reading RFID tags that are outside of the vehicle but may be in range of the RFID reader. A possible solution to avoid this issue may involve reducing power of the RFID reader, however, by doing such, RFID coverage of RFID tags inside the vehicle may be negatively impacted.

In a similar example scenario, a worker with a wearable RFID reader may handle a package and while handling the package, the wearable RFID may read an RFID tag on the package. However, the wearable RFID reader may also detect and read stray packages within a vicinity of the wearable reader. Such reading of stray packages may be unintended and would require additional effort from repeated readings and isolation of intended packages.

In a related example scenario, an overhead RFID reader may be installed in a retail store and configured to track merchandise (with RFID tags) interacted with by customers and movement of the merchandise. However, in such a configuration, in addition to reading RFID tags of merchandise interacted with by customers, surrounding stationary/static merchandise with RFID tags may also be read by the overhead RFID reader.

The aforementioned difficulties result from the limitation of RFID tags being non-intelligent or non-programmable, and therefore being responsive to any read signal of RFID readers.

Various example embodiments of the present disclosure overcome such technical challenges and difficulties in RFID systems, and provide various technical advancements and improvements. In accordance with various examples of the present disclosure, an RFID tag may comprise a piezo-based circuit configured to modify communication functionality of the RFID tag. A piezo-based circuit may comprise a circuit that generates electricity from mechanical pressure. For example, a piezo-based circuit may convert energy created by changes in force, acceleration, pressure, or strain.

In some embodiments, the piezo-based circuit may be coupled to an antenna of an RFID tag such that the impedance and operation of the antenna is tuned based on physical movement of the RFID tag. For example, the antenna may be tuned to an impedance of a tag integrated circuit (IC) such that the antenna is operational for responding to RFID read commands (e.g., receiving and transmitting RF signals) when the RFID tag is moving. Otherwise, the antenna may be detuned to a high impedance such that the antenna is non-operational and RF signals cannot be received and/or transmitted to the RFID tag when the RFID tag is stationary. An RFID tag with an antenna tunable based on movement may be suitable for use with a wearable RFID reader, as disclosed in the above example scenario, where a user may want to detect packages being handled.

In some embodiments, the piezo-based circuit may be coupled to an input/output (I/O) port of an RFID tag IC. The RFID tag IC may respond to read signals of an RFID reader with discrete signals based on electric signals generated from the piezo-based circuit. For example, an RFID tag comprising an RFID tag IC coupled to a piezo-based circuit may generate various discrete signals based on movement of the RFID tag. The RFID tag IC may generate a high discrete signal when the RFID tag is in motion and generate a low discrete signal when the RFID tag is stationary. As such, the RFID reader may identify assets having RFID tags with high discrete signals (indicative of movement) and distinguish from RFID tags having low discrete signals (indicative of being stationary). An RFID tag configured to generate discrete signals based on movement may be suited for a package vehicle or a retail store, as disclosed in the above scenarios, where it may be desirable to read both moving and static RFID tags, e.g., inside the vehicle/store.

FIG. 1 is a schematic diagram of an example architecture 100 for reading RFID tags. The architecture 100 includes an RFID reader computing entity 106 configured to generate read signals, receive one or more responses to the read signals from respective one or more RFID tags 102, and process the one or more responses either locally on RFID reader computing entity 106 or via host computing entity 104. For example, RFID reader computing entity 106 or via host computing entity 104 may convert responses from the RFID tags 102 into a form that can then be utilized. In one example embodiment, the RFID reader computing entity 106 may receive responses comprising encoded data transmitted from RFID tags 102 and decode the data for processing by host computing entity 104. In some embodiments, RFID reader computing entity 106 may communicate with at least one of the RFID tags 102 using a radio frequency (RF) signal. The RF signal may comprise a frequency of approximately 125-135 KHz, 13.56 MHz, 860-960 MHz, 2.45 GHz, or 5.8 GHz, although one skilled in the art will appreciate that other frequencies could be employed.

Figure 2:
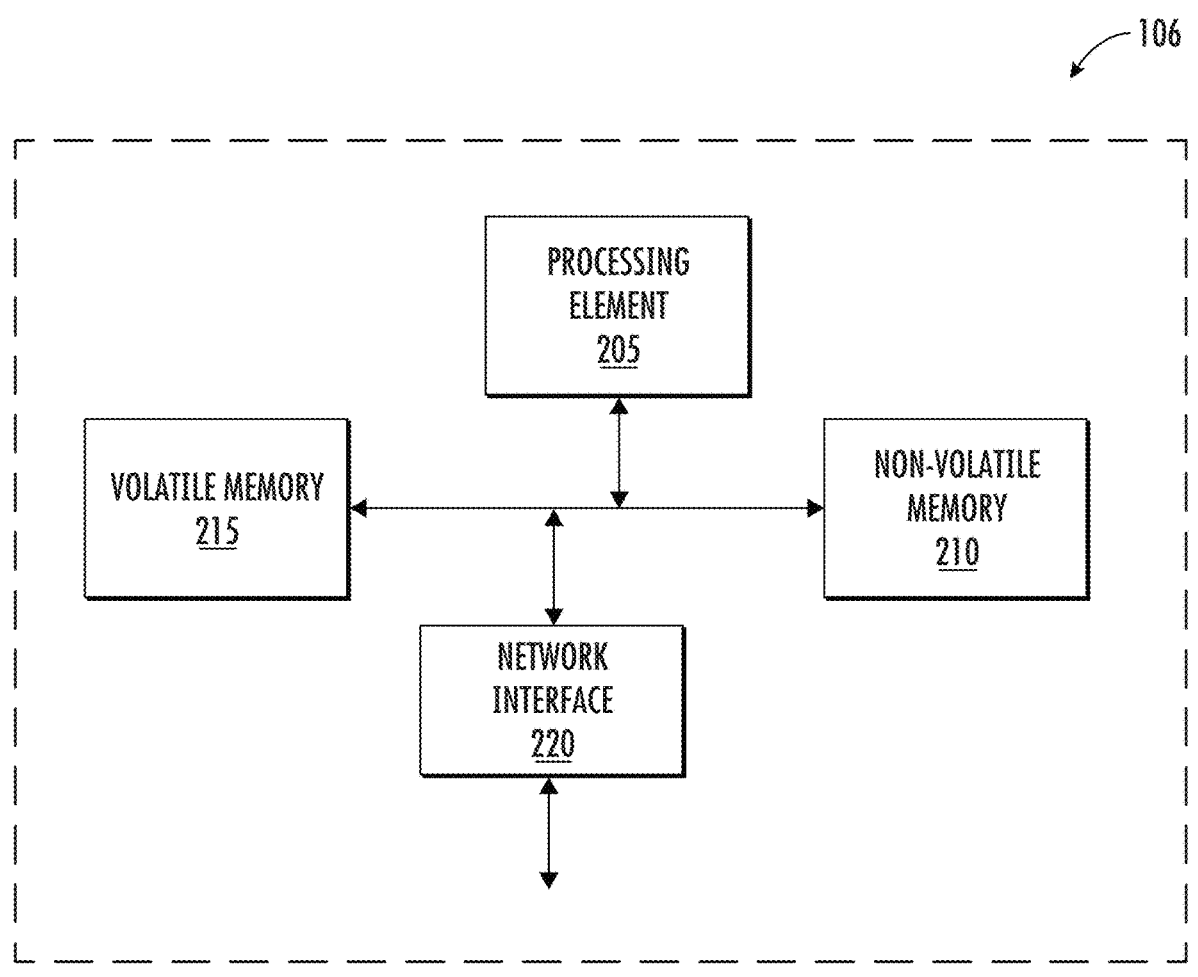
FIG. 2 illustrates an example radio frequency identification (RFID) reader computing entity.

FIG. 2 provides a schematic of an RFID reader computing entity 106 according to one embodiment of the present disclosure. As depicted in FIG. 2, in some embodiments, the RFID reader computing entity 106 may include, or be in communication with, one or more processing elements 205 (also referred to as processors, processing circuitry, and/or similar terms used herein interchangeably) that communicate with other elements within the RFID reader computing entity 106 via a bus, for example. As will be understood, the processing element 205 may be embodied in a number of different ways.

For example, the processing element 205 may be embodied as one or more complex programmable logic devices (CPLDs), microprocessors, multi-core processors, coprocessing entities, application-specific instruction-set processors (ASIPs), microcontrollers, and/or controllers. Further, the processing element 205 may be embodied as one or more other processing devices or circuitry. The term circuitry may refer to an entirely hardware embodiment or a combination of hardware and computer program products. Thus, the processing element 205 may be embodied as integrated circuits, application specific integrated circuits (ASICs), field programmable gate arrays (FPGAs), programmable logic arrays (PLAs), hardware accelerators, other circuitry, and/or the like.

As will therefore be understood, the processing element 205 may be configured for a particular use or configured to execute instructions stored in volatile or non-volatile media or otherwise accessible to the processing element 205. As such, whether configured by hardware or computer program products, or by a combination thereof, the processing element 205 may be capable of performing steps or operations according to embodiments of the present disclosure when configured accordingly.

In some embodiments, the RFID reader computing entity 106 may further include, or be in communication with, non-volatile media (also referred to as non-volatile storage, memory, memory storage, memory circuitry, and/or similar terms used herein interchangeably). In some embodiments, the non-volatile storage or memory may include one or more non-volatile memory 210, including, but not limited to, hard disks, read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, conductive-bridging random access memory (CBRAM), phase-change random access memory (PRAM), ferroelectric random-access memory (FeRAM), non-volatile random-access memory (NVRAM), magnetoresistive random-access memory (MRAM), resistive random-access memory (RRAM), Silicon-Oxide-Nitride-Oxide-Silicon memory (SONOS), floating junction gate random access memory (FJG RAM), Millipede memory, racetrack memory, and/or the like.

As will be recognized, the non-volatile storage or memory media may store databases, database instances, database management systems, data, applications, programs, program modules, scripts, source code, object code, byte code, compiled code, interpreted code, machine code, executable instructions, and/or the like. The term database, database instance, database management system, and/or similar terms used herein interchangeably may refer to a collection of records or data that is stored in a computer-readable storage medium using one or more database models, such as a hierarchical database model, network model, relational model, entity-relationship model, object model, document model, semantic model, graph model, and/or the like.

In some embodiments, the RFID reader computing entity 106 may further include, or be in communication with, volatile media (also referred to as volatile storage, memory, memory storage, memory circuitry and/or similar terms used herein interchangeably). In some embodiments, the volatile storage or memory may also include one or more volatile memory 215, including, but not limited to, random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM), double data rate synchronous dynamic random access memory (DDR SDRAM), double data rate type two synchronous dynamic random access memory (DDR2 SDRAM), double data rate type three synchronous dynamic random access memory (DDR3 SDRAM), Rambus dynamic random access memory (RDRAM), Twin Transistor RAM (TTRAM), Thyristor RAM (T-RAM), Zero-capacitor (Z-RAM), Rambus in-line memory module (RIMM), dual in-line memory module (DIMM), single in-line memory module (SIMM), video random access memory (VRAM), cache memory, register memory, and/or the like.

As will be recognized, the volatile storage or memory media may be used to store at least portions of the databases, database instances, database management systems, data, applications, programs, program modules, scripts, source code, object code, byte code, compiled code, interpreted code, machine code, executable instructions, and/or the like being executed by, for example, the processing element 205. Thus, the databases, database instances, database management systems, data, applications, programs, program modules, scripts, source code, object code, byte code, compiled code, interpreted code, machine code, executable instructions, and/or the like may be used to control certain aspects of the operation of the RFID reader computing entity 106 with the assistance of the processing element 205 and operating system.

As indicated, in some embodiments, the RFID reader computing entity 106 may also include one or more network interfaces 220 for communicating with various computing entities, such as host computing entity 104, by communicating data, content, information, and/or similar terms used herein interchangeably that can be transmitted, received, operated on, processed, displayed, stored, and/or the like. Such communication may be executed using a wired data transmission protocol, such as fiber distributed data interface (FDDI), digital subscriber line (DSL), Ethernet, asynchronous transfer mode (ATM), frame relay, data over cable service interface specification (DOCSIS), or any other wired transmission protocol. Similarly, the RFID reader computing entity 106 may be configured to communicate via wireless external communication networks using any of a variety of protocols, such as general packet radio service (GPRS), Universal Mobile Telecommunications System (UMTS), Code Division Multiple Access 2000 (CDMA2000), CDMA2000 1× (1×RTT), Wideband Code Division Multiple Access (WCDMA), Global System for Mobile Communications (GSM), Enhanced Data rates for GSM Evolution (EDGE), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), IEEE 802.11 (Wi-Fi), Wi-Fi Direct, 802.16 (WiMAX), ultra-wideband (UWB), infrared (IR) protocols, near field communication (NFC) protocols, Wibree, Bluetooth protocols, wireless universal serial bus (USB) protocols, and/or any other wireless protocol.

The one or more network interfaces 220 may further comprise one or more antennas, one or more transmitters (e.g., radio), and one or more receivers (e.g., radio) in communication with processing element 205 that provides signals to and receives signals from the one or more transmitters and the one or more receivers, correspondingly. The signals provided to and received from the one or more transmitters and the one or more receivers, correspondingly, may include signaling information/data in accordance with the aforementioned wireless communication protocols for communication with host computing entity 104, as well as RFID standards and protocols for communicating with RFID tags 102.

Although not shown, the RFID reader computing entity 106 may include, or be in communication with, one or more input elements, such as a keyboard input, a mouse input, a touch screen/display input, motion input, movement input, audio input, pointing device input, joystick input, keypad input, and/or the like. The RFID reader computing entity 106 may also include, or be in communication with, one or more output elements (not shown), such as audio output, video output, screen/display output, motion output, movement output, and/or the like.

Figure 3:
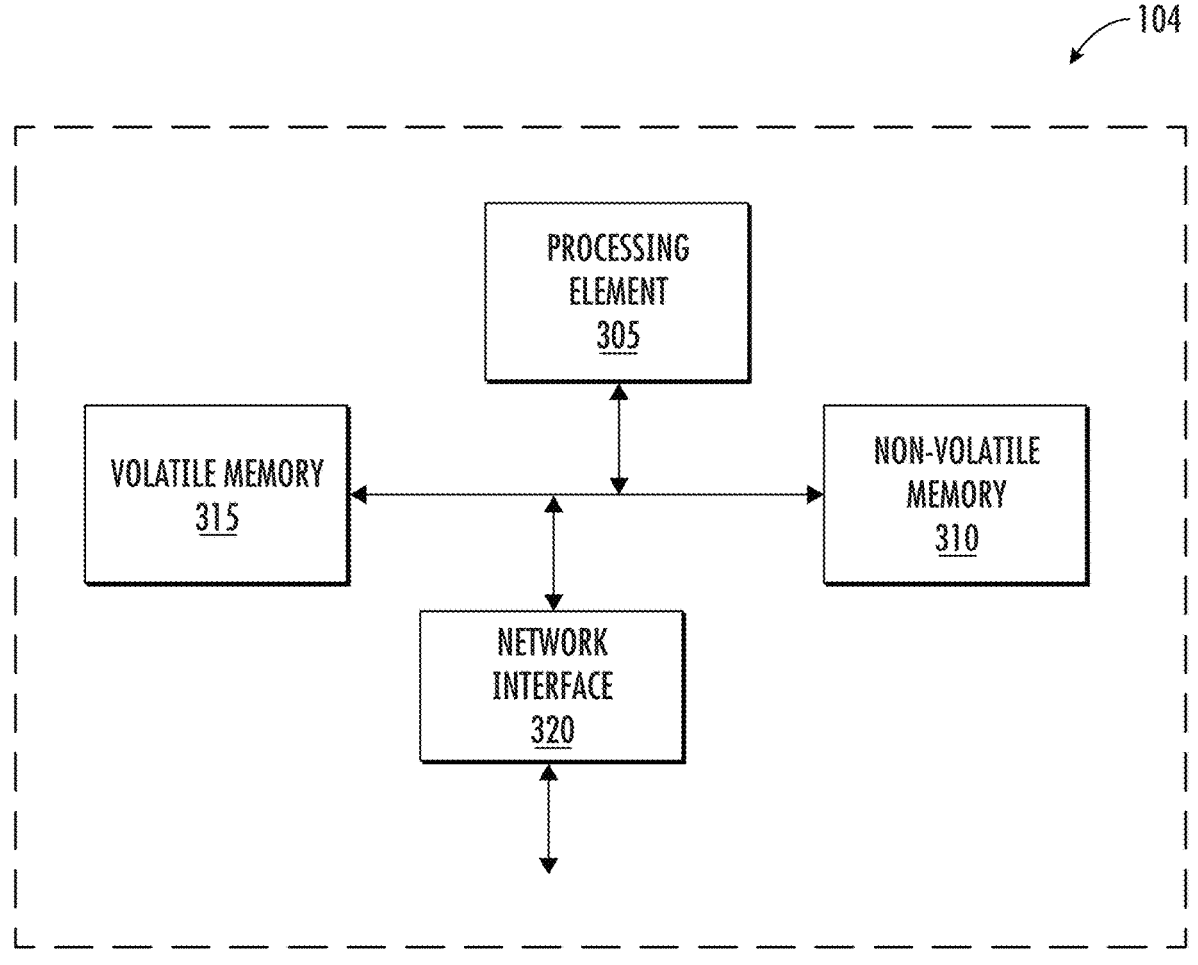
FIG. 3 illustrates an example host computing entity.

FIG. 3 provides a schematic of a host computing entity 104 according to one embodiment of the present disclosure. In general, the terms computing entity, computer, entity, device, system, and/or similar words used herein interchangeably may refer to, for example, one or more computers, computing entities, desktops, mobile phones, tablets, phablets, notebooks, laptops, distributed systems, kiosks, input terminals, servers or server networks, blades, gateways, switches, processing devices, processing entities, set-top boxes, relays, routers, network access points, base stations, the like, and/or any combination of devices or entities adapted to perform the functions, operations, and/or processes described herein. Such functions, operations, and/or processes may include, for example, transmitting, receiving, operating on, processing, displaying, storing, determining, creating/generating, monitoring, evaluating, comparing, and/or similar terms used herein interchangeably. In some embodiments, these functions, operations, and/or processes can be performed on data, content, information, and/or similar terms used herein interchangeably.

As shown in FIG. 3, in some embodiments, the host computing entity 104 may include, or be in communication with, one or more processing elements 305 (also referred to as processors, processing circuitry, and/or similar terms used herein interchangeably) that communicate with other elements within the host computing entity 104 via a bus, for example. As will be understood, the processing element 305 may be embodied in a number of different ways.

For example, the processing element 305 may be embodied as one or more CPLDs, microprocessors, multi-core processors, coprocessing entities, ASIPs, microcontrollers, and/or controllers. Further, the processing element 305 may be embodied as one or more other processing devices or circuitry. The term circuitry may refer to an entirely hardware embodiment or a combination of hardware and computer program products. Thus, the processing element 305 may be embodied as integrated circuits, ASICs, FPGAs, PLAs, hardware accelerators, other circuitry, and/or the like.

As will therefore be understood, the processing element 305 may be configured for a particular use or configured to execute instructions stored in volatile or non-volatile media or otherwise accessible to the processing element 305. As such, whether configured by hardware or computer program products, or by a combination thereof, the processing element 305 may be capable of performing steps or operations according to embodiments of the present disclosure when configured accordingly.

In some embodiments, the host computing entity 104 may further include, or be in communication with, non-volatile media (also referred to as non-volatile storage, memory, memory storage, memory circuitry, and/or similar terms used herein interchangeably). In some embodiments, the non-volatile storage or memory may include one or more non-volatile memory 310, including, but not limited to, hard disks, ROM, PROM, EPROM, EEPROM, flash memory, MMCs, SD memory cards, Memory Sticks, CBRAM, PRAM, FeRAM, NVRAM, MRAM, RRAM, SONOS, FJG RAM, Millipede memory, racetrack memory, and/or the like.

As will be recognized, the non-volatile storage or memory media may store databases, database instances, database management systems, data, applications, programs, program modules, scripts, source code, object code, byte code, compiled code, interpreted code, machine code, executable instructions, and/or the like. The term database, database instance, database management system, and/or similar terms used herein interchangeably may refer to a collection of records or data that is stored in a computer-readable storage medium using one or more database models, such as a hierarchical database model, network model, relational model, entity-relationship model, object model, document model, semantic model, graph model, and/or the like.

In some embodiments, the host computing entity 104 may further include, or be in communication with, volatile media (also referred to as volatile storage, memory, memory storage, memory circuitry and/or similar terms used herein interchangeably). In some embodiments, the volatile storage or memory may also include one or more volatile memory 315, including, but not limited to, RAM, DRAM, SRAM, FPM DRAM, EDO DRAM, SDRAM, DDR SDRAM, DDR2 SDRAM, DDR3 SDRAM, RDRAM, TTRAM, T-RAM, Z-RAM, RIMM, DIMM, SIMM, VRAM, cache memory, register memory, and/or the like.

As will be recognized, the volatile storage or memory media may be used to store at least portions of the databases, database instances, database management systems, data, applications, programs, program modules, scripts, source code, object code, byte code, compiled code, interpreted code, machine code, executable instructions, and/or the like being executed by, for example, the processing element 305. Thus, the databases, database instances, database management systems, data, applications, programs, program modules, scripts, source code, object code, byte code, compiled code, interpreted code, machine code, executable instructions, and/or the like may be used to control certain aspects of the operation of the host computing entity 104 with the assistance of the processing element 305 and operating system.

As indicated, in some embodiments, the host computing entity 104 may also include one or more network interfaces 320 for communicating with various computing entities, such as by communicating data, content, information, and/or similar terms used herein interchangeably that can be transmitted, received, operated on, processed, displayed, stored, and/or the like. Such communication may be executed using a wired data transmission protocol, such as FDDI, DSL, Ethernet, ATM, frame relay, DOCSIS, or any other wired transmission protocol. Similarly, the host computing entity 104 may be configured to communicate via wireless external communication networks using any of a variety of protocols, such as GPRS, UMTS, CDMA2000, 1×RTT, WCDMA, GSM, EDGE, TD-SCDMA, LTE, E-UTRAN, EVDO, HSPA, HSDPA, Wi-Fi, Wi-Fi Direct, WiMAX, UWB, IR protocols, NFC protocols, Wibree, Bluetooth protocols, wireless USB protocols, and/or any other wireless protocol.

Although not shown, the host computing entity 104 may include, or be in communication with, one or more input elements, such as a keyboard input, a mouse input, a touch screen/display input, motion input, movement input, audio input, pointing device input, joystick input, keypad input, and/or the like. The host computing entity 104 may also include, or be in communication with, one or more output elements (not shown), such as audio output, video output, screen/display output, motion output, movement output, and/or the like.

Figure 4:
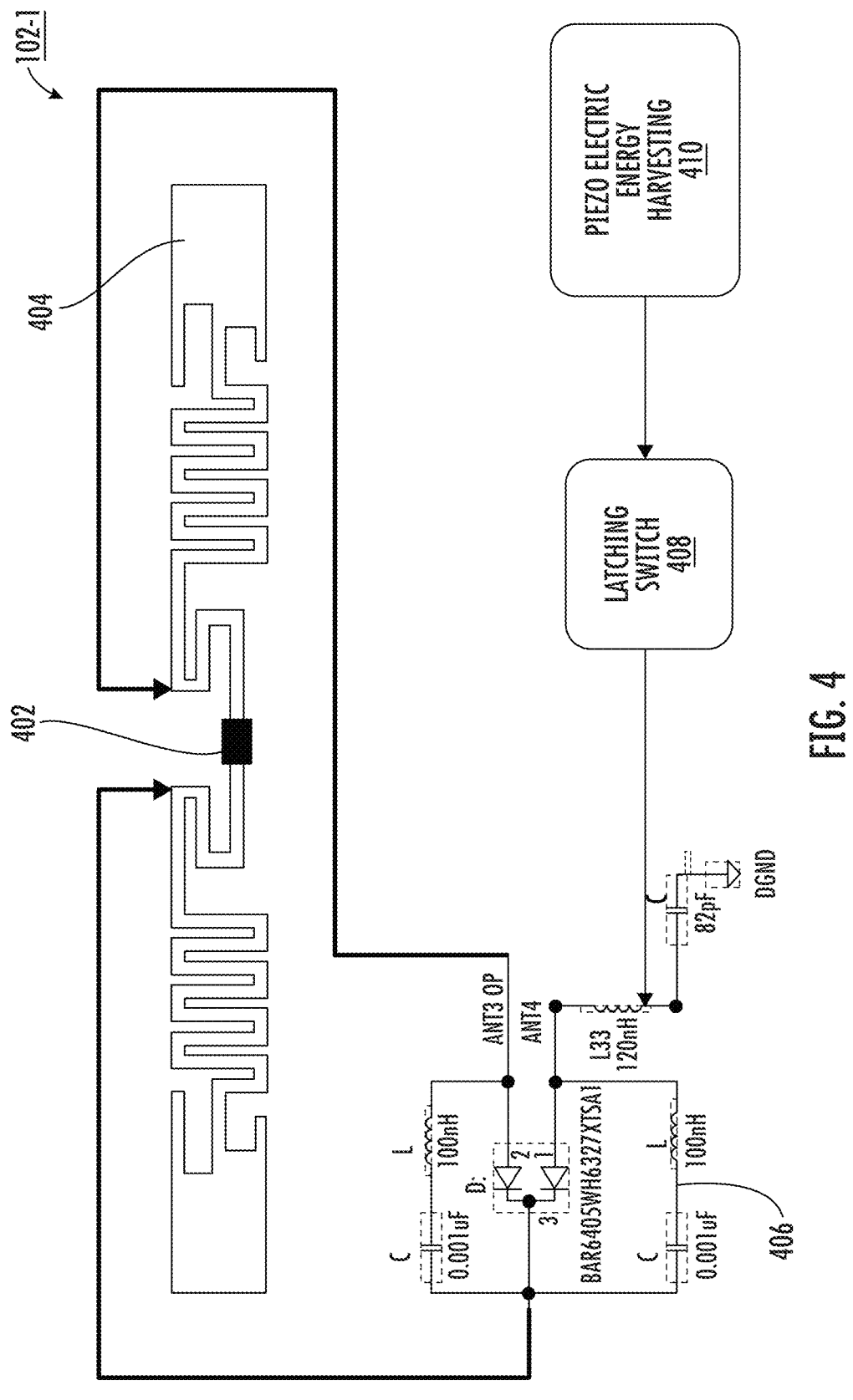
FIG. 4 illustrates an example RFID tag in accordance with some embodiments discussed herein.

FIG. 4 depicts an example schematic representative of an RFID tag that can be used in conjunction with some embodiments of the present disclosure. As depicted in FIG. 4, RFID tag 102-1 comprises a tag IC 402 and an antenna 404 coupled therewith. The antenna 404 may enable RFID tag 102-1 to receive RF signals from RFID readers, such as RFID reader computing entity 106, and transmit RF signals to the RFID readers in response to the received RF signals. For example, RF signals may be generated by the tag IC 402 and transmitted via antenna 404 in response to a read signal received from RFID reader computing entity 106 also via antenna 404. In some embodiments, the tag IC 402 may comprise a digital memory, storing data associated with an underlying object coupled to the RFID tag 102-1. For example, a transmitted RF signal can provide identification information, such as a serial number or identification number, to the RFID reader computing entity 106.

In the depicted embodiment, antenna 404 comprises a circuit loop coupled to an impedance tuned circuit 406. Impedance tuned circuit 406 may control operation of antenna 404 and tag IC 402 by tuning a circuit impedance (e.g., impedance matching) of the antenna 404. Impedance tuned circuit 406 is further coupled to and may be driven by latching switch 408 and piezo electric energy harvesting module 410. Latching switch 408 may comprise a switch that maintains an output signal based on an input signal after being actuated until the latching switch 408 is actuated again or provided with a signal to turn off the latching switch 408. The latching switch 408 may be actuated (e.g., turned on) by piezo electric energy harvesting module 410 to provide power from piezo electric energy harvesting module 410 to impedance tuned circuit 406.

In some embodiments, functionality of antenna 404 and tag IC 402 may be based on a circuit impedance tuned by impedance tuned circuit 406, where the circuit impedance tuned by impedance tuned circuit 406 may be based on whether power is received from piezo electric energy harvesting module 410. As such, the ability of RFID tag 102-1 to receive or transmit RF signals may depend on a circuit impedance tuned by impedance tuned circuit 406. In particular, when impedance tuned circuit 406 is provided with power from piezo electric energy harvesting module 410, impedance tuned circuit 406 may be configured to tune the circuit impedance of the circuit loop of antenna 402 to match a functional impedance of tag IC 402 such that RFID tag 102-1 is able to receive or transmit RF signals. According to various embodiments of the present disclosure, a circuit impedance tuned by impedance tuned circuit 406 for antenna 404 affects the ability of the RFID tag 102-1 to receive power, thereby controlling reading by RFID readers, such as RFID reader computing entity 106. Additionally or alternatively, the circuit impedance tuned by impedance tuned circuit 406 can determine a level of modulated back-scattered signal re-radiated to an RFID reader.

Figure 5:
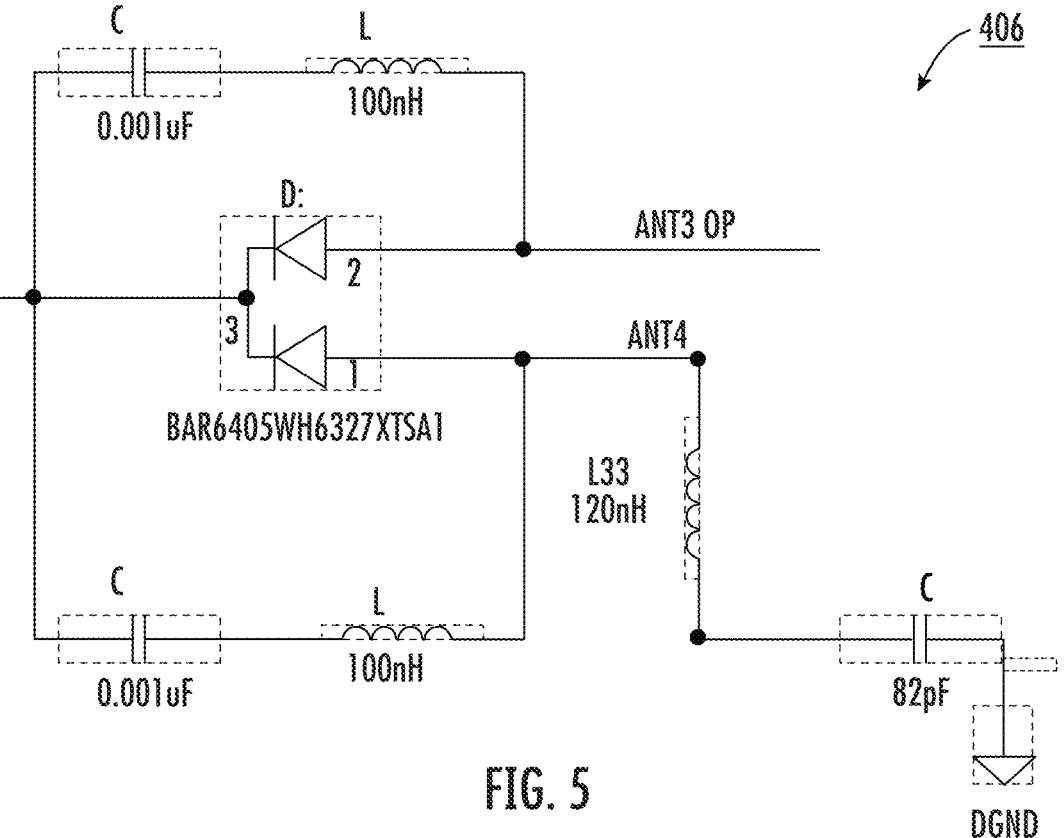
FIG. 5 illustrates an example impedance tuned circuit in accordance with some embodiments discussed herein.

Referring to FIG. 5, impedance tuned circuit 406 comprises a circuit including one or more inductors, capacitors, and diodes that interfaces antenna 404 and tag IC 402 with output from latching switch 408. In particular, impedance tuned circuit 406 may tune a circuit impedance for antenna 404 to match a functional impedance of tag IC 402 when latching switch 408 is actuated to provide power from piezo electric energy harvesting module 410 to impedance tuned circuit 406. In some embodiments, impedance tuned circuit 406 may be configured to (i) tune a first circuit impedance for antenna 404 when no power is received from piezo electric energy harvesting module 410, and (ii) tune a second circuit impedance for antenna 404 when power is received from piezo electric energy harvesting module 410. In one example embodiment, the first circuit impedance for antenna 404 may comprise a non-functional circuit impedance and the second circuit impedance for antenna 404 may comprise a functional circuit impedance. The non-functional circuit impedance may prevent the antenna 404 from receiving and transmitting RF signals and the functional circuit impedance may allow the antenna 404 to receive and transmit RF signals. For example, the non-functional circuit impedance may comprise an impedance that is greater than a functional impedance of tag IC 402 and the functional circuit impedance may comprise the functional impedance of tag IC 402.

According to various embodiments of the present disclosure, power from piezo electric energy harvesting module 410 may be used to tune the circuit impedance of antenna 404 to match the functional impedance of tag IC 402 when, for example, a package box with RFID tag 102-1 is in motion. Movement of RFID tag 102-1 (and, by extension, the piezo electric energy harvesting module 410) may cause latching switch 408 to be actuated by piezo electric energy harvesting module 410 thereby delivering power from piezo electric energy harvesting module 410 to impedance tuned circuit 406. Piezo electric energy harvesting module 410 may delivery power to impedance tuned circuit 406 using energy generated from movement of RFID tag 102-1. Upon RFID tag 102-1 becoming stationary (e.g., non-movement), latching switch 408 may be deactivated by piezo electric energy harvesting module 410 to stop supplying power from piezo electric energy harvesting module 410 to impedance tuned circuit 406.

Figure 6:
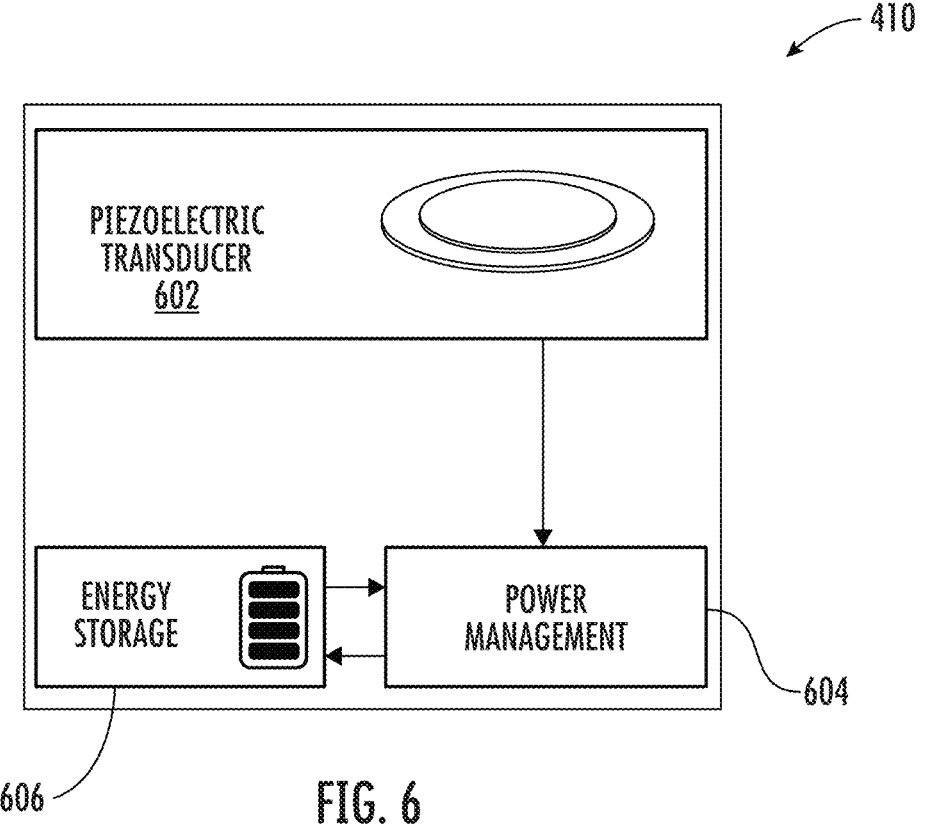
FIG. 6 illustrates an example piezo electric energy harvesting module in accordance with some embodiments discussed herein.

FIG. 6 depicts an example piezo electric energy harvesting module. Piezo electric energy harvesting module 410 comprises piezoelectric transducer 602, power management module 604, and energy storage unit 606. Piezoelectric transducer 602 may comprise a device that measures mechanical energy or force and converts the energy to a proportional form of electrical energy or signal. Power management module 604 may comprise an electronic system that manages storage of electrical energy generated by piezoelectric transducer 602 (e.g., generated by movement experienced by piezo transducer 602) to energy storage unit 606. In some embodiments, power management module 604 may be further configured to send signals to actuate latching switch 408 upon a detection of movement by the piezo transducer 602 and send signals to deactivate latching switch 408 upon a detection of non-movement by the piezo transducer 602.

The electrical energy stored in energy storage unit 606 may supply a continuous and stable source of power to impedance tuned circuit 406 such that impedance tuned circuit 406 is able to maintain an operational impedance. That is, power supplied by energy storage unit 606 may be more consistent than power directly generated by piezoelectric transducer 602 itself. As such, usage of energy storage unit 606 ensures that the operational impedance tuned by impedance tuned circuit 406 is stable and suitable maintaining operation of antenna 404 and tag IC 402, e.g., during movement experienced by piezo transducer 602.

Figure 7:
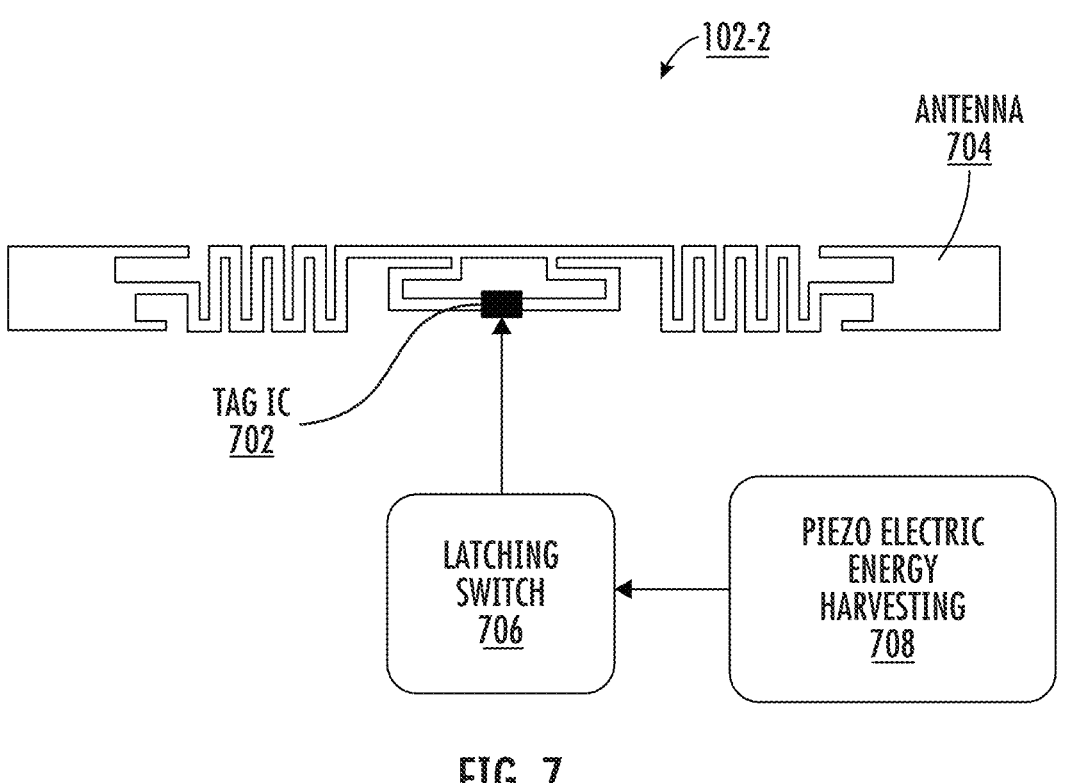
FIG. 7 illustrates another example of an RFID tag in accordance with some embodiments discussed herein.

FIG. 7 depicts another example schematic representative of an RFID tag that can be used in conjunction with some other embodiments of the present disclosure. As depicted in FIG. 7, RFID tag 102-2 comprises a tag IC 702 and an antenna 704 coupled therewith. The antenna 704 may enable RFID tag 102-2 to receive RF signals from RFID readers, such as RFID reader computing entity 106, and transmit RF signals to the RFID readers in response to the received RF signals. For example, RF signals may be generated by the tag IC 702 and transmitted via antenna 704 in response to a read signal received from RFID reader computing entity 106 also via antenna 704. In some embodiments, the tag IC 702 may comprise a digital memory, storing data associated with an underlying object coupled to the RFID tag 102-2. For example, a transmitted RF signal can provide identification information, such as a serial number or identification number, to the RFID reader computing entity 106.

In contrast to antenna 404 of RFID tag 102-1, functionality of tag IC 702 and antenna 704 does not depend on a circuit impedance tuned by an impedance tuned circuit. Particularly, antenna 704 omits a circuit loop coupled to an impedance tuned circuit, and instead, comprises a static impedance that is matched with an operational impedance of tag IC 702. RFID tag 102-2 further comprises a piezo electric energy harvesting module 708 coupled to an I/O port of tag IC 702 via a latching switch 706. Tag IC 702 may convert electric signals received at its I/O port to discrete signals that may be communicated in RF signals in response to RFID read signals.

The electric signals received at the I/O port of tag IC 702 may be based on electric signals generated by piezo electric energy harvesting module 708 from movement of the RFID tag 102-2 (and, by extension, piezo electric energy harvesting module 708). As such, the tag IC 702 may generate discrete signals based on movement of the RFID tag 102-2. For example, the tag IC 702 may generate a high discrete signal when RFID tag 102-2 is in motion and generate a low discrete signal when RFID tag 102-2 is stationary. Accordingly, RFID tag 102-2 may identify in its response to RF read signals from an RFID reader (e.g., RFID reader computing entity 106) whether it is either in motion or stationary. In some embodiments, an RFID reader (e.g., RFID reader computing entity 106) may identify first one or more assets and distinguish the first one or more assets from second one or more assets based on discrete signals in response RF signals transmitted from RFID tags associated with the first one or more assets and the second one or more assets. For example, each of the first one or more assets is associated with an RFID tag 102-2 that responds with RF signals comprising high discrete signals (indicative of movement), and each of the second one or more assets associated with an RFID tag 102-2 that responds with RF signals comprising low discrete signals (indicative of being stationary).

It is to be understood that the disclosure is not to be limited to the specific embodiments disclosed, and that modifications and other embodiments are intended to be included within the scope of the appended claims. Although specific terms are employed herein, they are used in a generic and descriptive sense only and not for purposes of limitation, unless described otherwise.

The invention claimed is:

1. A radio frequency identification (RFID) tag comprising:
   a tag integrated circuit (IC), wherein the tag IC comprises a functional impedance;
   an antenna coupled to the tag IC;
   an impedance tuned circuit coupled to the antenna via a latching switch; and
   a piezo electric energy harvesting module coupled to the impedance tuned circuit via the latching switch, wherein the piezo electric energy harvesting module actuates the latching switch based on a movement of the RFID tag to electrically connect the impedance tuned circuit to the antenna, wherein in an instance in which the impedance tuned circuit is electrically coupled to the antenna, the impedance of a combination of the impedance tuned circuit and the antenna matches the impedance of the tag IC such that radio frequency (RF) signals are transmitted and received via the antenna.

2. The RFID tag of claim 1, wherein the impedance tuned circuit is further configured to control operation of the antenna and the tag IC by tuning the circuit impedance of the antenna.

3. The RFID tag of claim 1, further comprising the latching switch coupled from the piezo electric energy harvesting module to the impedance tuned circuit.

4. The RFID tag of claim 1, wherein the piezo electric energy harvesting module comprises a piezoelectric transducer, a power management module, and an energy storage unit.

5. The RFID tag of claim 1, wherein the impedance tuned circuit is further configured to: (i) tune a first circuit impedance for the antenna based on no power is received from the piezo electric energy harvesting module, and (ii) tune a second circuit impedance for the antenna based on power is received from the piezo electric energy harvesting module.

6. The RFID tag of claim 5, wherein the first circuit impedance for the antenna prevents the antenna from receiving and transmitting the RF signals and the second circuit impedance for the antenna allows the antenna to receive and transmit the RF signals.

7. The RFID tag of claim 6, wherein a non-functional circuit impedance is greater than a functional circuit impedance of the tag IC.

8. The RFID tag of claim 1, wherein the piezo electric energy harvesting module is further configured to supply the power to the impedance tuned circuit based on the movement of the RFID tag.

9. The RFID tag of claim 1, wherein the piezo electric energy harvesting module is further configured to stop supplying the power to the impedance tuned circuit based on non-movement of the RFID tag.

10. A radio frequency identification (RFID) tag comprising:

an antenna configured to receive and transmit radio frequency (RF) signals;

a tag integrated circuit (IC) coupled to the antenna, the tag IC comprising an input/output (I/O) port, and the tag IC is configured to generate discrete signals for transmission in the RF signals based on electric signals received on the I/O port; and a piezo electric energy harvesting module coupled to the I/O port of the tag IC via a latching switch, wherein the piezo electric energy harvesting module actuates the latching switch based on a movement of the RFID tag to generate the electric signals to the I/O port of the tag IC such that the RF signals are transmitted and received via the antenna.

11. The RFID tag of claim 10, wherein the tag IC is further configured to generate the discrete signals based on the movement of the RFID tag.

12. The RFID tag of claim 11, wherein the tag IC is further configured to generate a high discrete signal based on the RFID tag being in motion.

13. The RFID tag of claim 11, wherein the tag IC is further configured to generate a low discrete signal based on the RFID tag being stationary.

* * * * *